United States Patent
Li et al.

(10) Patent No.: US 9,171,732 B1
(45) Date of Patent: Oct. 27, 2015

(54) THIN FILM TRANSISTOR AND METHOD FOR MANUFACTURING THE SAME, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Tiansheng Li, Beijing (CN); Zhenyu Xie, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/514,968

(22) Filed: Oct. 15, 2014

(30) Foreign Application Priority Data

Jun. 18, 2014 (CN) .......................... 2014 1 0274116

(51) Int. Cl.
- *H01L 21/336* (2006.01)
- *H01L 21/306* (2006.01)
- *H01L 27/12* (2006.01)
- *H01L 29/66* (2006.01)

(52) U.S. Cl.
CPC ...... *H01L 21/30604* (2013.01); *H01L 27/1222* (2013.01); *H01L 29/66742* (2013.01)

(58) Field of Classification Search
CPC .................. H01L 29/66742; H01L 29/66765; H01L 29/66772; H01L 29/6678
USPC ........................................................ 438/158
See application file for complete search history.

(56) References Cited

U.S. PATENT DOCUMENTS

2011/0303923 A1* 12/2011 Noh et al. ............. H01L 29/458
257/72

* cited by examiner

*Primary Examiner* — Daniel Shook
(74) *Attorney, Agent, or Firm* — Harness, Dickey & Pierce, P.L.C.

(57) ABSTRACT

A method for manufacturing a thin film transistor according to the present disclosure may include the following steps of: performing a two-step etching on an active layer such that part of the active layer is consistent with a source-drain electrode layer, and etching the active layer within a photoresist-removed-area to form an active layer tail; ashing a photoresist layer such that a contour of the photoresist layer is consistent with that of the source-drain electrode layer; further etching the source-drain electrode layer to form a source-drain electrode layer pattern including a source electrode and a drain electrode, and etching off a doped semiconductor layer between the source electrode and the drain electrode, and meanwhile etching off the active layer tail.

20 Claims, 4 Drawing Sheets

-PRIOR ART-

THIN FILM TRANSISTOR AND METHOD FOR MANUFACTURING THE SAME, AND DISPLAY DEVICE

CROSS-REFERENCE TO RELATED APPLICATION

This application claims priority to Chinese Patent Application No. 201410274116.4 filed on Jun. 18, 2014, the disclosures of which are incorporated in their entirety by reference herein.

TECHNICAL FIELD

The present disclosure relates to the field of display technology, in particular to a thin film transistor (TFT) and a method for manufacturing the same, and a display device.

BACKGROUND

High-pixel high-definition Pixels Per Inch (PPI) products have become the mainstream for display currently in order to adapt to a higher integration level. Currently, a six-mask solution has been proposed in order to achieve the purpose of increasing throughput during the process of manufacturing thin film transistors. The core technology characteristic of Advanced Super Dimension Switch (ADS) is described as: a multi-dimensional electric field is formed from an electric field generated by an edge of a slot electrode and an electric field generated between a slot electrode layer and a plate-shaped electrode layer in a same plane, such that all oriented liquid crystal molecules between and right above slot electrodes in a liquid crystal cell are rotatable, thereby improving liquid crystal working efficiency and increasing light transmission. Advanced Super Dimension Switch can improve the image quality of TFT-LCD products, and have advantages such as high resolution, high transmittance, low power consumption, wide visual angle, high aperture ratio, low chromatic aberration, push Mura free, etc.

In an ADS mode, i.e., Fringe Field Switching (FFS) mode, an edge electric field is generated through the electrodes between pixels in a same plane such that all oriented liquid crystal molecules between and right above electrodes can be switched by rotation in a direction parallel to the plane of the substrate, thereby improving the light transmittance of the liquid crystal layer. The primary creative scheme in the 6-mask thin film transistor manufacturing process in the ADS liquid crystal display technology is that a gate insulating layer and an active layer are formed in one patterning process. For example, "a pattern comprising an active layer and a gate electrode insulating layer is formed by a third patterning process" as mentioned in the publication text of PCT patent application WO 2013143294 A1.

However, there are problems in the implementation process. As shown in FIG. 1, a gate electrode 2, a gate electrode insulating layer 3, an active layer 4, and a source-drain electrode layer 5 are formed on a substrate 1. In the wet etching step of the source-drain electrode layer 5 by a semi-transparent mask technology, since the metal material of the source-drain electrode layer 5 is indented by about 1-2 μm as compared with the photoresist, and the subsequent dry etching on the active layer 4 tends to etch in a vertical direction, the active layer 4 is almost not indented as compared with the source electrode to be formed and the upper photoresist layer covering the drain electrode. Because wet etching has the characteristic of isotropy, a width of horizontal etching is close to a depth of vertical etching. Thus, there will be a certain difference (discrepancy) between the pattern of the upper photoresist and the pattern etched on a lower material. Referring to FIG. 1, the pattern in the lower layer is the source electrode and drain electrode formed by performing wet etching on the source-drain electrode layer 5, the pattern of the upper photoresist is substantially consistent with the active layer 4, the source-drain electrode layer 5 is etched horizontally to certain extent to result in indent. Part of the active layer 4 will be etched off in a subsequent photoresist ashing, the second etching process of the source-drain electrode layer 5 and the etching process of the doped semiconductor layer on the active layer 4, thereby inevitably producing an active layer tail (a-Si tail), as shown in the area a in FIG. 1. In the trend of wiring refinement, the active layer tail will exert big load on the thin film transistor and will even affect the performance of the thin film transistor.

SUMMARY

(I) Technical Problem to be Solved

A purpose of the present disclosure is to provide a thin film transistor where an active layer tail of the thin film transistor is removed and a method for manufacturing the same, and a display device.

(II) Technical Solution

The present disclosure is implemented through the following technical solutions: a method for manufacturing a thin film transistor, including the following steps of:

S1. forming an active layer and a source-drain electrode layer;

S2. coating a photoresist layer on the source-drain electrode layer, exposing and developing a substrate coated with the photoresist layer to form a photoresist pattern including a photoresist-remained area, a photoresist-half-remained area and a photoresist-removed area;

S3. etching by using the photoresist pattern as a mask, and etching off the source-drain electrode layer within the photoresist-removed area;

S4. performing a two-step etching on the active layer, wherein the two-step etching includes a first etching, which makes a contour of the active layer below the source-drain electrode layer covered by the photoresist layer consistent with that of the source-drain electrode layer; and a second etching, which etches the active layer within the photoresist-removed area and ensures a longitudinal etching contour of the active layer, and forms an active layer tail; and S5. ashing the photoresist layer such that the contour of the photoresist layer becomes consistent with that of the source-drain electrode layer; etching the source-drain electrode layer by using the photoresist pattern as a mask to form a source-drain electrode pattern including a source electrode and a drain electrode, and etching off a doped semiconductor layer between the source electrode and the drain electrode, and meanwhile etching off the active layer tail.

For example, in the step S4, the first etching may adopt an etching method of increasing a speed ratio of horizontal etching to longitudinal etching.

For example, in the step S4, the second etching may adopt an etching method of decreasing a speed ratio of horizontal etching to longitudinal etching.

For example, in the first etching, the etching method of increasing the speed ratio of horizontal etching to longitudinal etching may adopt a method of increasing an etching reaction gas flow ratio.

For example, in the first etching, the etching method of increasing the speed ratio of horizontal etching to longitudinal etching may adopt a method of decreasing an etching power.

For example, in the first etching, the etching method of increasing the speed ratio of horizontal etching to longitudinal etching may adopt a method of increasing an etching gas pressure.

For example, in the first etching, the etching method of increasing the speed ratio of horizontal etching to longitudinal etching may adopt a method of adding active gas components.

For example, in the second etching, the etching method of decreasing the speed ratio of horizontal etching to longitudinal etching may adopt a method of decreasing an etching reaction gas flow ratio.

For example, in the second etching, the etching method of decreasing the speed ratio of horizontal etching to longitudinal etching may adopt a method of increasing an etching power.

For example, in the second etching, the etching method of decreasing the speed ratio of horizontal etching to longitudinal etching may adopt a method of decreasing an etching gas pressure.

For example, in the step S3, the source-drain electrode layer may be etched by adopting a wet etching method.

For example, in the step S4, the active layer may be etched by adopting an over-etching method during the second etching.

For example, in the step S4, a thickness of the active layer etched off during the first etching may be about one third of a total thickness of the active layer.

For example, in the step S3, the source-drain electrode layer may be indented by about 1-2 μm as compared with the photoresist layer.

For example, in the step S2, the source-drain electrode layer may be coated with a positive photoresist layer.

For example, in the step S2, the substrate coated with the photoresist layer may be exposed and developed by using a grayscale mask plate or a halfscale mask plate.

For example, in the step S4, a dry etching method may be adopted for performing two-step etching on the active layer.

For example, the dry etching method may include a reactive ion etching through a chemical reaction and a physical ion bombardment etching.

In addition, the present disclosure may further provide a thin film transistor, which is manufactured by the above method for manufacturing a thin film transistor.

In addition, the present disclosure may further provide a display device, including a plurality of thin film transistors as described above.

(III) Beneficial Effects

Compared with the manufacturing methods and products provided in the prior art, the present disclosure has the following advantages:

During the process of manufacturing a thin film transistor by using a semi-transparent mask technology according to the present disclosure, the dry etching method for etching an active layer is divided into two steps, i.e., a horizontal etching and a longitudinal etching, which decreases or removes the active layer tail, and can reduce the damage to the gate electrode insulating layer. Under the trend of wiring refinement in the thin film transistor, this will reduce the load on the thin film transistor and improve the performance of the thin film transistor.

Figure 1:
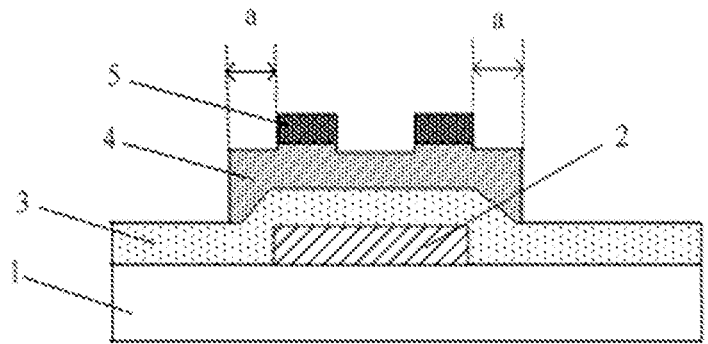
FIG. 1 illustrates an active layer tail during the process of manufacturing a thin film transistor provided in the prior art.

In the drawings, the components indicated by various reference signs are listed as below:

1 substrate;
2 gate electrode;
3 gate electrode insulating layer
4 active layer;
5 source-drain electrode layer;
6 photoresist layer;
7 passivation layer;
a active layer tail

SPECIFIC EMBODIMENTS

The specific embodiments of the present disclosure will be described in detail below in connection with the accompanying drawings.

Figure 9:
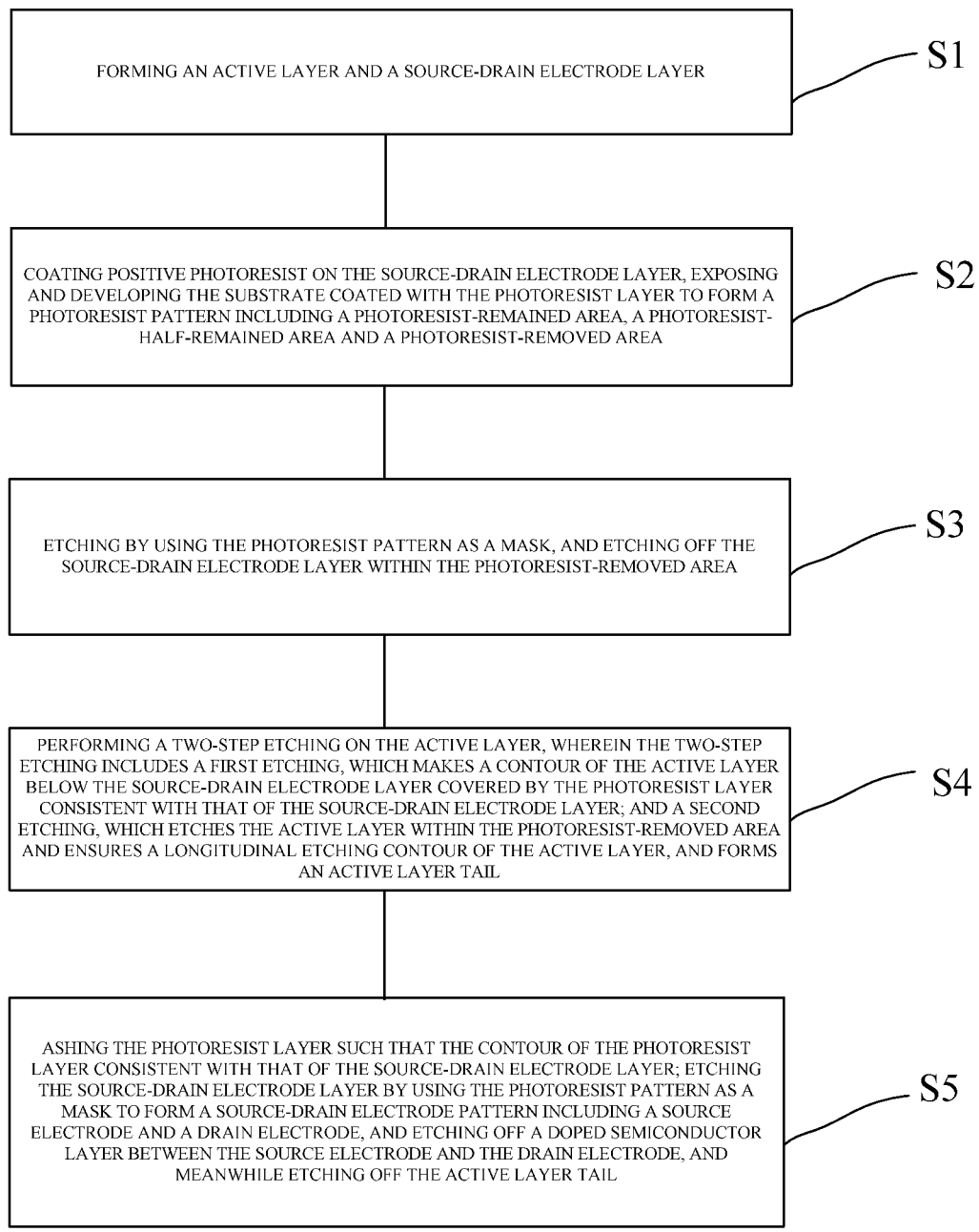
FIG. 9 is a flow chart of the process for manufacturing a thin film transistor provided in the present disclosure.

As shown in FIG. 9, a method for manufacturing a thin film transistor includes the following steps:

S1. forming an active layer and a source-drain electrode layer.

Figure 2:
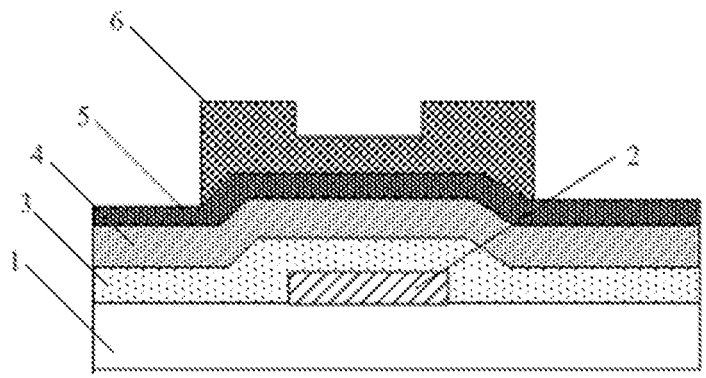
FIG. 2 illustrates a first component during the process of manufacturing a thin film transistor provided in the present disclosure.

As shown in FIG. 2, a gate electrode 2, a gate electrode insulating layer 3, an active layer 4 and a source-drain electrode layer 5 are formed on a substrate 1 in sequence.

Specifically, during the process of manufacturing a thin film transistor, the gate electrode 2 and the source-drain electrode layer 5 are formed of conductive materials such as metals like Mo. The gate electrode insulating layer 3 may be formed of oxides of silicon or other metallic oxide insulators by continuous deposition through a Plasma Enhanced Chemical Vapor Deposition (PECVD) method. The active layer 4 may be formed of, for example, Amorphous Silicon (a-Si). The gate electrode layer including the gate electrode 2 and the source-drain electrode layer 5 may be formed by, for example, a magnetron sputtering method. The active layer 4 may be formed by, for example, a chemical vapor deposition method.

S2. coating positive photoresist on the source-drain electrode layer 5; exposing and developing the substrate 1 coated with the photoresist layer 6 by using a grayscale mask plate or a halfscale mask plate to form a photoresist pattern including a photoresist-remained area, a photoresist-half-remained area and a photoresist-removed area, as shown in FIG. 2. Generally speaking, there are two kinds of photoresists, namely, positive photoresists and negative photoresists. The positive photoresists form soluble substances after being illuminated, while the negative photoresists form insoluble substances after being illuminated. The reason why positive photoresist, other than negative photoresist, is chosen in the present embodiment is that the photoresist in the photoresist-half-remained area needs to be exposed by directly using illumination subsequently, without the need of mask plates, in which case, the photoresist in the photoresist-half-remained area can be made to be completely soluble by properly controlling a light intensity, while the upper portion of the photoresist in the photoresist-remained area is soluble. This can reduce use of mask plates, simplify the process and decrease production costs.

Figure 3:
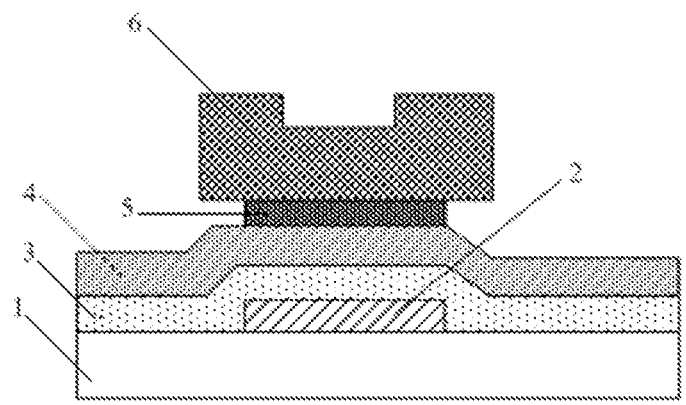
FIG. 3 illustrates a second component during the process of manufacturing a thin film transistor provided in the present disclosure.

S3. Etching by using the photoresist pattern as a mask, and etching off the source-drain electrode layer 5 within the photoresist-removed area, as shown in FIG. 3. Since the source-drain electrode layer 5 is made of a metal, the etching in this step is preferably performed by using a wet etching method. At this moment, the source-drain electrode layer 5 is indented by about 1-2 μm as compared with the photoresist layer 6. Since all semiconductor wet etchings have isotropy, the width of horizontal etching is substantially approximate to the depth of the vertical etching regardless of the etching on an oxide layer or etching on a metal layer. As thus, there is a certain difference (discrepancy) between the pattern of the upper photoresist and the pattern etched on the lower material.

Figure 4:
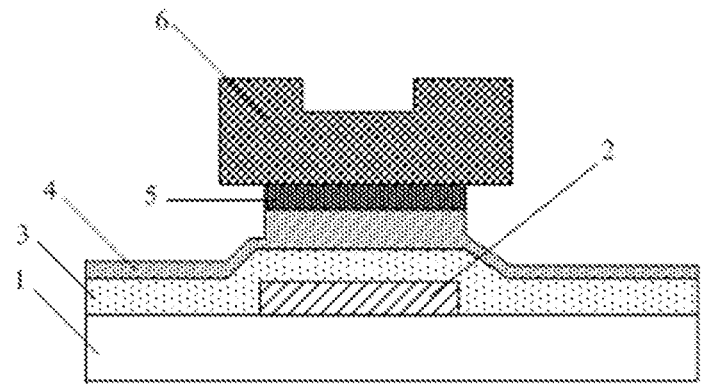
FIG. 4 illustrates a third component during the process of manufacturing a thin film transistor provided in the present disclosure.
Figure 5:
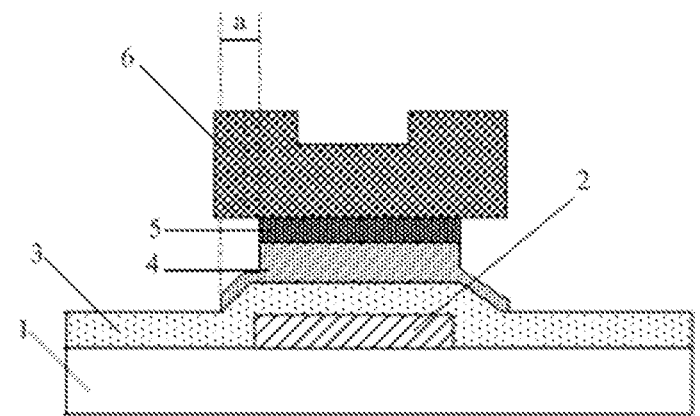
FIG. 5 illustrates a fourth component during the process of manufacturing a thin film transistor provided in the present disclosure.

S4. Performing a two-step etching on the active layer 4 by using, for example, a dry etching method. As shown in FIG. 4, the first etching is performed such that a contour of the active layer 4 right below the source-drain electrode layer 5 is consistent with the contour of the source-drain electrode layer 5. Further, as shown in FIG. 5, the second etching is performed to etch the active layer 4 within the photoresist-removed-area to ensure that a longitudinal etching contour of the active layer forms an active layer tail a.

Dry etching process produces atoms and atom groups through reaction of gas plasma generated from vacuum gas under the action of radio-frequency power. The atoms and atom groups react with the substances deposited on the substrate to generate volatile substances. In this embodiment, the dry etching process is bombarding the active layer by using chemical gas plasma. The chemical gas used in the dry etching process only etches non-metallic film layers without affecting metal layers, thus ensuring the accuracy of etching.

Herein, the dry etching method includes the characteristics of reactive ion etching by chemical reactions and physical ion bombardment etching. This method has dual advantages of anisotropy and high etching selection ratio. Dry etching is implemented by reactive ion etching by chemical reactions, and is embodied as generating volatile reaction products through reaction with the atoms on the surface of the active layer. The reactive ion etching by chemical reactions has the characteristic of a horizontal etching. In addition, dry etching further includes bombarding the active layer by using chemical gas plasma, which shows the characteristic of a longitudinal etching.

In this embodiment, in the first etching of the dry etching, an etching method of increasing a speed ratio of horizontal etching to longitudinal etching, such that a contour of the active layer right below the source-drain electrode layer is consistent with that of the source-drain electrode layer. Preferably, a thickness of the etched portion of the active layer is about one third of a total thickness of the active layer.

Specifically, the method specifically adopted by the first etching may include any one of the following:

I. Increasing an etching reaction gas flow ratio. For example, when SF6 is selected as the etching gas for performing etching, the content of F ions can be increased by increasing the flow ratio of SF6, thereby increasing its chemical etching to accelerate the horizontal etching speed. Although the longitudinal etching will also be accelerated, the speed ratio of horizontal etching to longitudinal etching is increased, thereby achieving the final purpose of the horizontal etching by controlling a length of processing period.

II. A method of adding active gas components. The etching gas does not contain any active gas, for example, oxygen. If oxygen is added into the reaction gas, the catalyzing function of oxygen will accelerate the speed of the horizontal etching, while the longitudinal etching will be slowed down due to the addition of oxygen, increase of molecule intensity and decrease of the number of plasma bombardment substrates, thus achieving the result initially set.

III. A method of decreasing an etching power. Reduction of etching power will directly influence on plasma etching efficiency. After the etching power is decreased, the electron-absorbing capability of the upper and lower electrode plates of an etching cavity is decreased, which causes decrease of the plasma etching concentration, thus causing decrease of the longitudinal etching speed, thereby achieving the purpose of increasing the speed ratio of horizontal etching to longitudinal etching.

IV. A method of increasing an etching gas pressure. Increase of an etching gas pressure will cause the molecule concentration of the reaction cavity to increase, and hinder the longitudinal etching by active components, and meanwhile chemical reaction activity increases as the molecule concentration increases, which directly causes the horizontal etching speed to increase, thereby achieving the purpose of increasing the speed ratio of horizontal etching to longitudinal etching.

Part of the active layer is indented to be consistent with the contour of the source-drain electrode layer by increasing the horizontal etching process efficiency. In general conditions, increase of horizontal etching speed will cause the lower gate electrode insulating layer to be also etched at the same time. Therefore, about one third of the active layer will be etched off, which reduces damage to the gate electrode insulating layer.

In the second etching of the dry etching, an etching method of decreasing the speed ratio of horizontal etching to longitudinal etching. The active layer within the photoresist-removed-area is etched off to ensure that the longitudinal etching contour of the active layer to form an active layer tail a, as shown in FIG. 5. Considering that the active layer is not completely uniform when deposited on the gate electrode insulating layer, over-etching needs to be performed on the active layer to some extent to ensure that there is no tail in the gate electrode insulating layer. Therefore, an over-etching method is preferably adopted in the second step to etch the active layer.

Specifically, the second etching in the dry etching method may specifically include any one of the following:

I. Decreasing the etching reaction gas flow ratio. For example, when SF6 is selected as the etching gas for performing etching, the content of F ions can be decreased by decreasing the flow ratio of SF6, thereby decreasing its chemical etching, i.e., slowing down the horizontal etching speed. Although the longitudinal etching will also be slowed down, the speed ratio of horizontal etching to longitudinal etching is decreased, thereby achieving the final purpose of the longitudinal etching by controlling a length of processing period.

II. A method of increasing an etching power. Increase of etching power will directly influence on plasma etching efficiency. After the etching power is increased, the electron-absorbing capability of the upper and lower electrode plates of an etching cavity is enhanced, which causes increase of the plasma etching concentration, thus causing increase of the longitudinal etching speed, thereby achieving the purpose of decreasing the speed ratio of horizontal etching to longitudinal etching.

III. A method of decreasing an etching gas pressure. Decrease of an etching gas pressure will cause the molecule concentration of the reaction cavity to decrease. The chemical reaction activity decreases as the molecule concentration decreases, which directly causes the horizontal etching speed to decrease, thereby achieving the purpose of decreasing the speed ratio of horizontal etching to longitudinal etching.

The second etching to the active layer within the photoresist-removed-area will not damage the gate electrode insulating layer. After the second etching, an active layer tail a with a thickness of about two third of that of the active layer is formed, as shown in FIG. 5.

Figure 6:
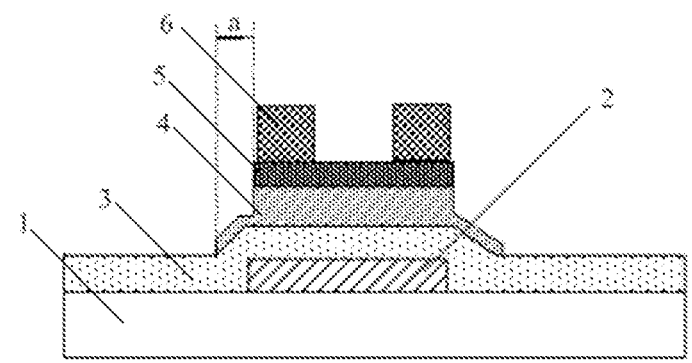
FIG. 6 illustrates a fifth component during the process of manufacturing a thin film transistor provided in the present disclosure.
Figure 7:
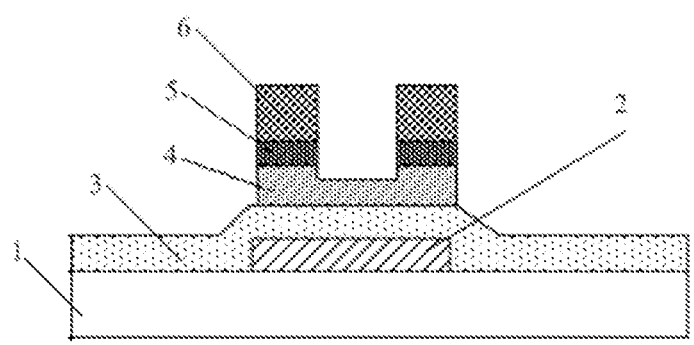
FIG. 7 illustrates a sixth component during the process of manufacturing a thin film transistor provided in the present disclosure.

S5. As shown in FIG. 6, the photoresist layer 6 is ashed such that the contour of the photoresist layer 6 is consistent with that of the source-drain electrode layer 5. Ashing may be implemented by adopting chemical reaction etching. As shown in FIG. 7, the source-drain electrode layer 5 is then etched (dry etching) by using the photoresist pattern as a mask to form a source-drain electrode layer pattern including a source electrode and a drain electrode, and a doped semiconductor layer between the source electrode and drain electrode is etched off, and meanwhile the active layer tail a is etched off, and then the photoresist is peeled off.

In this step, when the source-drain electrode layer 5 is etched, the etching condition can etch off part of the active layer tail a, this part being the active layer tail a with a thickness of about one third of the thickness of the active layer 4. At the same time of etching off the doped semiconductor between the source electrode and the drain electrode, the thickness of about one third of the active layer tail a is also etched off.

Figure 8:
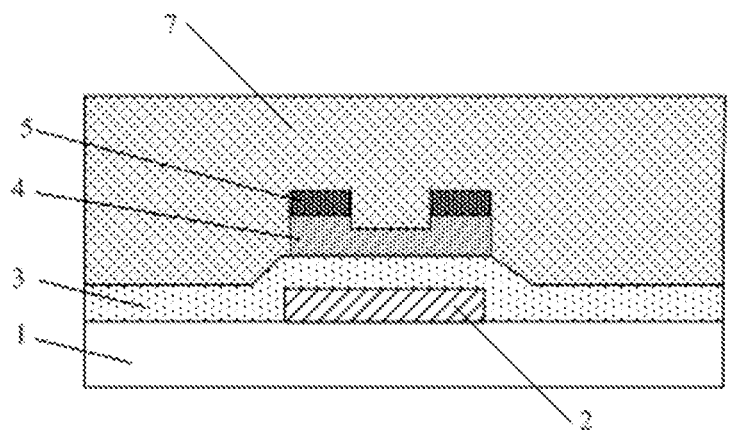
FIG. 8 illustrates a seventh component during the process of manufacturing a thin film transistor provided in the present disclosure.

Finally, as shown in FIG. 8, a passivation layer 7 is formed on the source-drain electrode layer 5 of the substrate 1. The passivation layer 7 can be formed by depositing oxides, nitrides or oxygen-nitrogen compounds through a PECVD method.

During the process of manufacturing a thin film transistor by using a semi-transparent mask technology, the dry etching method for etching an active layer is divided into two steps, i.e., a horizontal etching and a longitudinal etching, which ensures less influence on the gate electrode insulating layer and decreases or even removes the active layer tail. Under the trend of wiring refinement in the thin film transistor, this will reduce the load on the thin film transistor and improve the performance of the thin film transistor.

The present embodiment further provides a thin film transistor, including a gate electrode, a gate electrode insulating layer, an active layer and a source electrode, and a drain electrode. The thin film transistor is manufactured by the above method for manufacturing a thin film transistor. The thin film transistor has no active layer tail, and the load on the thin film transistor is decreased, thus improving the performance of the thin film transistor.

This embodiment further provides a display device, such as an LCD panel, a PC, a mobile phone display screen, an LCD TV, including the above thin film transistors.

The above embodiments are only used for describing the present disclosure, but are not intended to limit the present disclosure. A person skilled in the art can make various changes and transformations without departing from the spirit and scope of the present disclosure. Therefore, all equivalent technical solutions shall also fall into the scope of the present disclosure. The patent protection scope of the present disclosure should be defined by the claims.

What is claimed is:

1. A method for manufacturing a thin film transistor, comprising the following steps of:
   S1. forming an active layer and a source-drain electrode layer;
   S2. coating a photoresist layer on the source-drain electrode layer, exposing and developing a substrate coated with the photoresist layer to form a photoresist pattern comprising a photoresist-remained area, a photoresist-half-remained area and a photoresist-removed area;
   S3. etching by using the photoresist pattern as a mask, and etching off the source-drain electrode layer within the photoresist-removed area;
   S4. performing a two-step etching on the active layer, wherein the two-step etching comprises a first etching, which makes a contour of the active layer below the source-drain electrode layer covered by the photoresist layer consistent with that of the source-drain electrode layer; and a second etching, which etches the active layer within the photoresist-removed area and ensures a longitudinal etching contour of the active layer, and forms an active layer tail; and
   S5. ashing the photoresist layer such that the contour of the photoresist layer becomes consistent with that of the source-drain electrode layer; etching the source-drain electrode layer by using the photoresist pattern as a mask to form a source-drain electrode pattern comprising a source electrode and a drain electrode, and etching off a doped semiconductor layer between the source electrode and the drain electrode, and meanwhile etching off the active layer tail.

2. The method according to claim 1, wherein in the step S4, the first etching adopts an etching method of increasing a speed ratio of horizontal etching to longitudinal etching.

3. The method according to claim 2, wherein in the first etching, the etching method of increasing the speed ratio of horizontal etching to longitudinal etching adopts a method of increasing an etching reaction gas flow ratio.

4. The method according to claim 2, wherein in the first etching, the etching method of increasing the speed ratio of horizontal etching to longitudinal etching adopts a method of decreasing an etching power.

5. The method according to claim 2, wherein in the first etching, the etching method of increasing the speed ratio of horizontal etching to longitudinal etching adopts a method of increasing an etching gas pressure.

6. The method according to claim 2, wherein in the first etching, the etching method of increasing the speed ratio of horizontal etching to longitudinal etching adopts a method of adding active gas components.

7. The method according to claim 1, wherein in the step S4, the second etching adopts an etching method of decreasing a speed ratio of horizontal etching to longitudinal etching.

8. The method according to claim 7, wherein in the second etching, the etching method of decreasing the speed ratio of horizontal etching to longitudinal etching adopts a method of decreasing an etching reaction gas flow ratio.

9. The method according to claim 7, wherein in the second etching, the etching method of decreasing the speed ratio of horizontal etching to longitudinal etching adopts a method of increasing an etching power.

10. The method according to claim 7, wherein in the second etching, the etching method of decreasing the speed ratio of horizontal etching to longitudinal etching adopts a method of decreasing an etching gas pressure.

11. The method according to claim 1, wherein in the step S3, the source-drain electrode layer is etched by adopting a wet etching method.

12. The method according to claim 1, wherein in the step S4, the active layer is etched by adopting an over-etching method during the second etching.

13. The method according to claim 1, wherein in the step S4, a thickness of the active layer etched off during the first etching is about one third of a total thickness of the active layer.

14. The method according to claim 1, wherein in the step S3, the source-drain electrode layer is indented by about 1-2 μm as compared with the photoresist layer.

15. The method according to claim 1, wherein in the step S2, the source-drain electrode layer is coated with a positive photoresist layer.

16. The method according to claim 1, wherein in the step S2, the substrate coated with the photoresist layer is exposed and developed by using a grayscale mask plate or a halfscale mask plate.

17. The method according to claim 1, wherein in the step S4, a dry etching method is adopted for performing the two-step etching on the active layer.

18. The method according to claim 17, wherein the dry etching method comprises a reactive ion etching through a chemical reaction and a physical ion bombardment etching.

19. A thin film transistor manufactured by the method for manufacturing a thin film transistor as described in claim 1.

20. A display device comprising a plurality of thin film transistors as described in claim 19.

* * * * *